(12) United States Patent
Fujima et al.

(10) Patent No.: US 11,445,609 B2
(45) Date of Patent: Sep. 13, 2022

(54) PRINTED CIRCUIT BOARD

(71) Applicant: Mitsubishi Electric Corporation, Tokyo (JP)

(72) Inventors: Yoshiko Fujima, Tokyo (JP); Toshiki Asai, Tokyo (JP); Yusuke Morimoto, Tokyo (JP); Kohei Sato, Tokyo (JP); Shunsuke Sasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 68 days.

(21) Appl. No.: 17/261,651

(22) PCT Filed: Feb. 13, 2019

(86) PCT No.: PCT/JP2019/005089
§ 371 (c)(1),
(2) Date: Jan. 20, 2021

(87) PCT Pub. No.: WO2020/021742
PCT Pub. Date: Jan. 30, 2020

(65) Prior Publication Data
US 2021/0267060 A1    Aug. 26, 2021

(30) Foreign Application Priority Data

Jul. 26, 2018    (JP) .............................. JP2018-140405

(51) Int. Cl.
*H05K 1/14* (2006.01)
*H05K 1/11* (2006.01)
(Continued)

(52) U.S. Cl.
CPC .............. *H05K 1/141* (2013.01); *H05K 1/11* (2013.01); *H05K 3/28* (2013.01); *H05K 3/34* (2013.01);
(Continued)

(58) Field of Classification Search
CPC ........... H05K 1/11; H05K 1/141; H05K 1/142
See application file for complete search history.

(56) References Cited

U.S. PATENT DOCUMENTS 8,479,390 B2    7/2013    Ohnishi et al.
2006/0049777 A1    3/2006    Kumagai et al.

FOREIGN PATENT DOCUMENTS

JP    2004-087748 A    3/2004
JP    4314809 B2    5/2004
(Continued)

OTHER PUBLICATIONS

International Search Report of the International Searching Authority dated Apr. 23, 2019 for the corresponding International application No. PCT/JP2019/005089 (and English translation).
(Continued)

*Primary Examiner* — Jeremy C Norris
(74) *Attorney, Agent, or Firm* — Posz Law Group, PLC (57) ABSTRACT

There is provided a printed circuit board in which an amount of molten solder adhering over electrodes adjacent to each other is increased in flow soldering. The printed circuit board according to the present invention includes: a first insulating substrate (6) having a mounting hole (15) that penetrates through the first insulating substrate (6) from a first surface (6*a*) to a second surface (6*b*); a second insulating substrate (18) including a connection portion (23*a*) that penetrates through the mounting hole (15) from the first surface (6*a*) side and protrudes from the second surface (6*b*); first electrodes (7 and 9) that are provided on the second surface (6*b*) and are arranged at an edge of the mounting hole (15); and second electrodes (19 and 25) provided on the connection portion (23*a*). The first electrodes (7 and 9) and the second electrodes (19 and 25) are joined by solder. The printed circuit board further includes a coating film (31) that is disposed at least on a front end side of the connection (Continued)

portion (23*a*) than a portion where the second electrodes (19 and 25) are joined to the first electrodes (7 and 9) by the solder.

6 Claims, 8 Drawing Sheets

(51) Int. Cl.
    *H05K 3/28*         (2006.01)
    *H05K 3/34*         (2006.01)
    *H05K 3/36*         (2006.01)

(52) U.S. Cl.
    CPC ....... *H05K 3/366* (2013.01); *H05K 2201/048* (2013.01); *H05K 2201/09009* (2013.01)

(56) References Cited

FOREIGN PATENT DOCUMENTS

| | | |
|---|---|---|
| JP | 2008-226964 A | 9/2008 |
| WO | 2017209168 A1 | 12/2017 |

OTHER PUBLICATIONS

Canadian Office Action dated Jan. 26, 2022 in the corresponding Canadian patent application No. 3107249.
Office Action (EESR) dated Aug. 31, 2021 in the corresponding European patent application No. 19841421.1.

PRINTED CIRCUIT BOARD

CROSS REFERENCE TO RELATED APPLICATIONS

This application is a U.S. national stage application of PCT/JP2019/005089 filed on Feb. 13, 2019, which claims priority to Japanese patent application no. 2018-140405, filed on Jul. 26, 2018, the contents of which are incorporated herein by reference.

FIELD

The present invention relates to a printed circuit board including a plurality of insulating substrates.

BACKGROUND

PTL 1 discloses a printed circuit board. The printed circuit board disclosed in PTL 1 includes a mother board and an auxiliary board. The auxiliary board is inserted into a slit provided in the mother board. A terminal pad provided on the mother board and a terminal pad provided on the auxiliary board are connected by solder.

CITATION LIST

Patent Literature

[PTL 1] JP 4314809 B2

SUMMARY

Technical Problem

The terminal pad provided on the mother board and the terminal pad provided on the auxiliary board are joined by, for example, flow soldering. More specifically, the mother board and the auxiliary board are conveyed by a conveyance device in a combined state, and are immersed in molten solder that is jetted upward. In a case of the printed circuit board disclosed in PTL 1, when the printed circuit board is separated from the solder jet in the flow soldering, the solder joining the terminal pad provided on the mother board and the terminal pad provided on the auxiliary board is easily taken by a solder bath side due to influence of gravity and surface tension of the solder.

The present invention is made to solve such issues. An object of the present invention is to provide a printed circuit board in which solder joining electrodes adjacent to each other is prevented from being taken by a solder bath side when the printed circuit board is separated from a solder jet in flow soldering, and an amount of molten solder adhering over the electrodes adjacent to each other is increased.

Solution to Problem

A printed circuit board according to the present invention includes: a first insulating substrate having a mounting hole therein, the mounting hole penetrating through the first insulating substrate from a first surface to a second surface; a second insulating substrate including a connection portion, the connection portion penetrating through the mounting hole from the first surface side and protrudes from the second surface; a first electrode provided on the second surface and disposed at an edge of the mounting hole; and a second electrode provided on the connection portion, the first electrode and the second electrode being joined by solder, and the printed circuit board further including a coating film that is disposed at least on a front end side of the connection portion than a portion where the second electrode is joined to the first electrode by the solder.

Advantageous Effects of Invention

According to the printed circuit board of the present invention, when the printed circuit board is separated from the solder jet in the flow soldering, it is possible to prevent the solder joining the electrodes adjacent to each other from being taken by the solder bath side, and to increase the amount of molten solder adhering over the electrodes adjacent to each other.

DESCRIPTION OF EMBODIMENTS

An embodiment of the present invention is described with reference to accompanying drawings. In the drawings, the same or equivalent parts are denoted by the same reference numerals, and repetitive descriptions are appropriately simplified or omitted. Note that the present invention is not limited to the following embodiment, and various modifications can be made without departing from the scope of the present invention.

Embodiment 1

Figure 1:
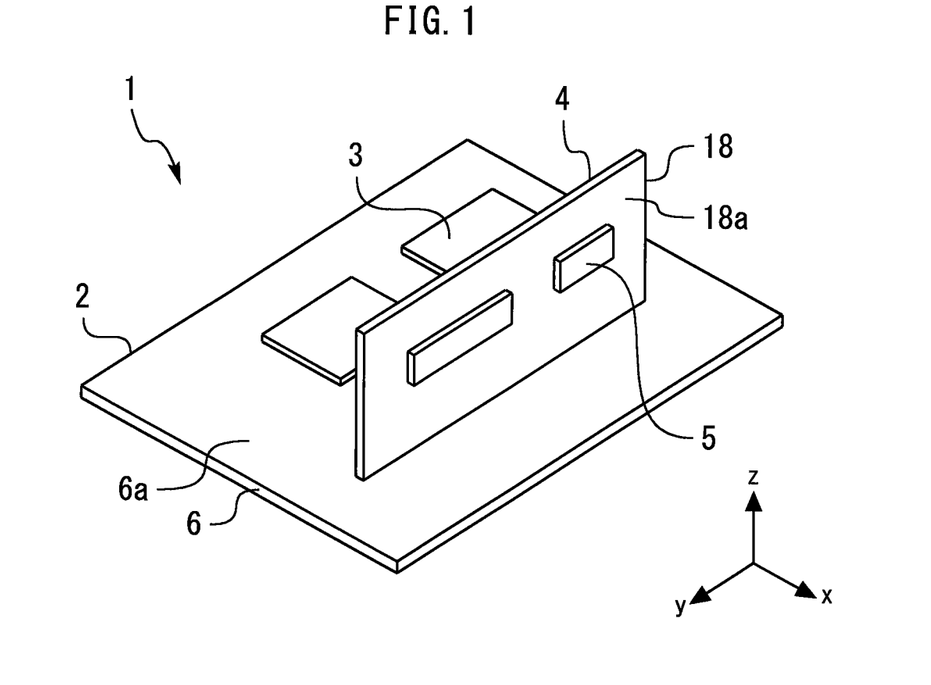
FIG. 1 is a perspective views of a printed circuit board according to Embodiment 1 of the present invention.
Figure 2:
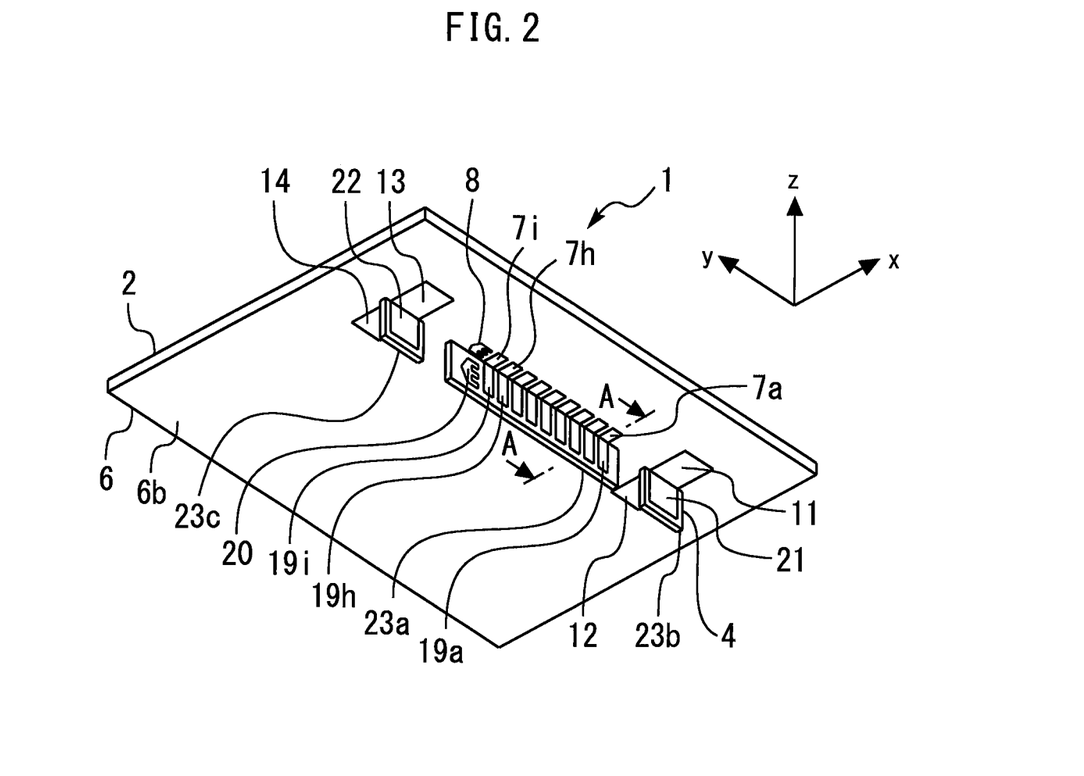
FIG. 2 is a perspective views of a printed circuit board according to Embodiment 1 of the present invention.
Figure 3:
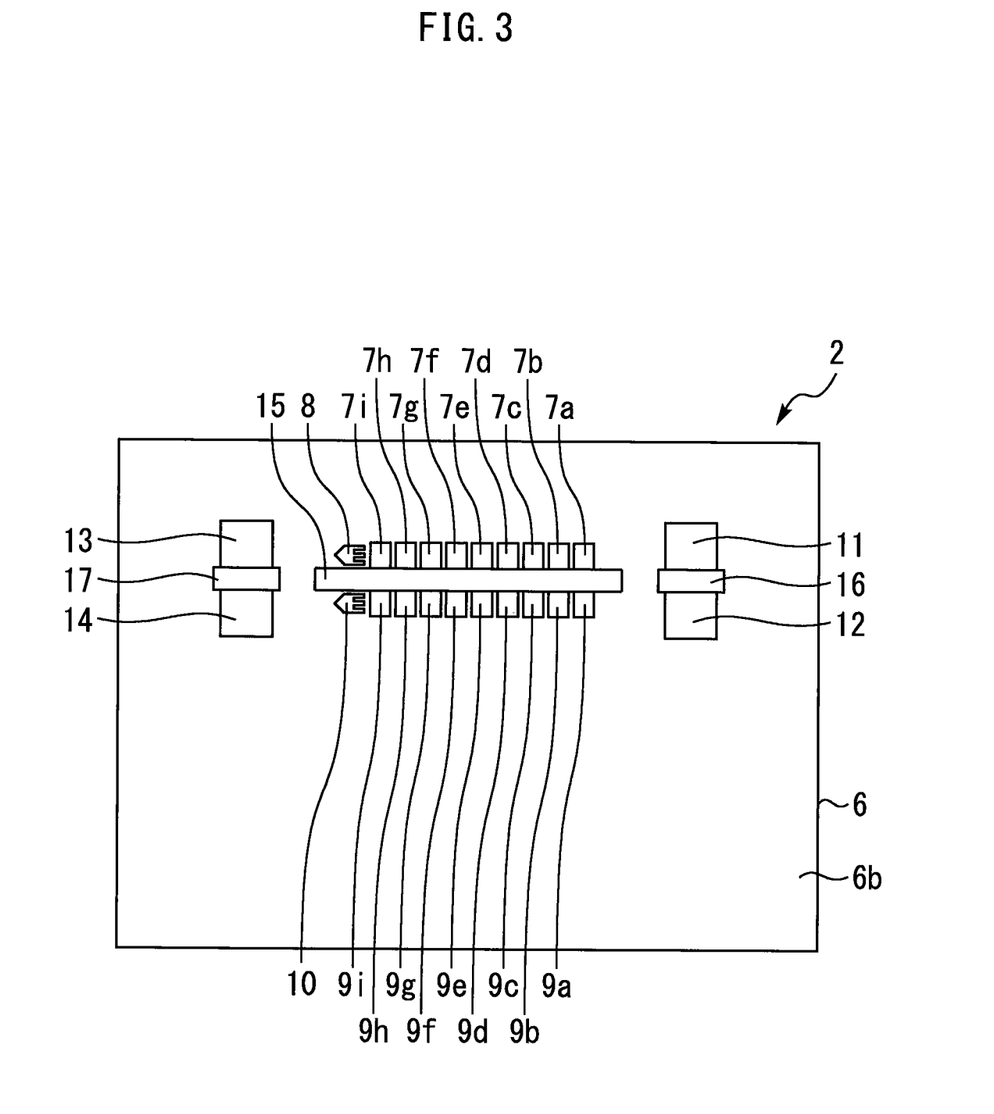
FIG. 3 is a bottom view of a printed wiring board included in the printed circuit board according to Embodiment 1 of the present invention.
Figure 4:
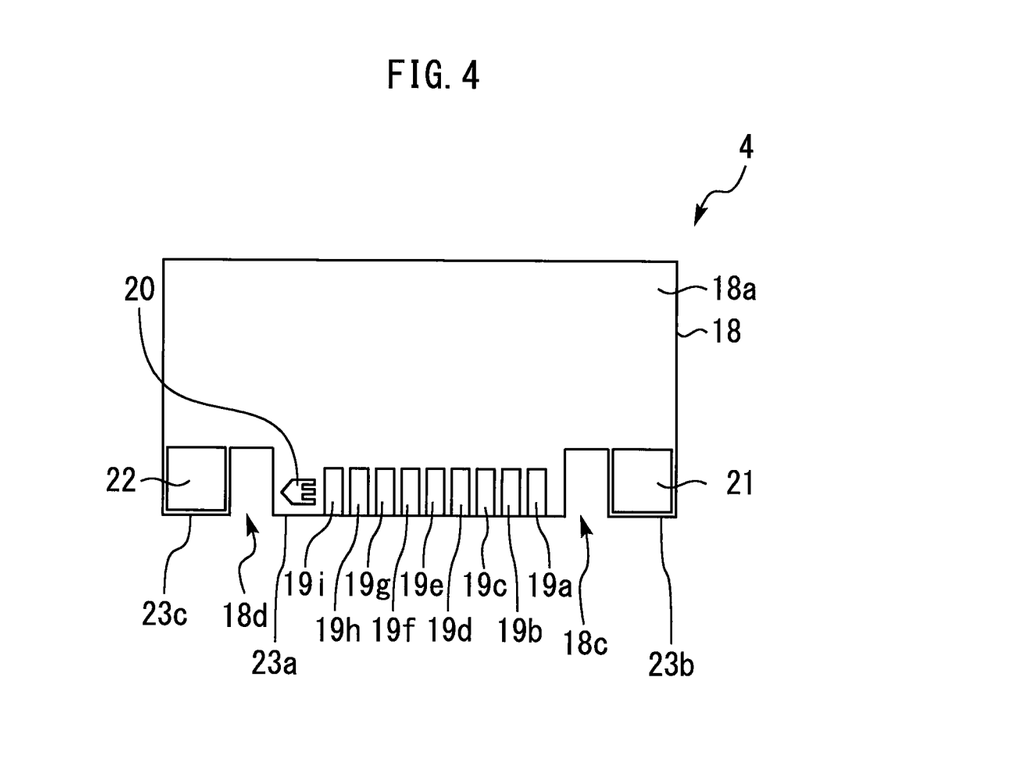
FIG. 4 is a front view of a printed wiring board included in the printed circuit board according to Embodiment 1 of the present invention.
Figure 5:
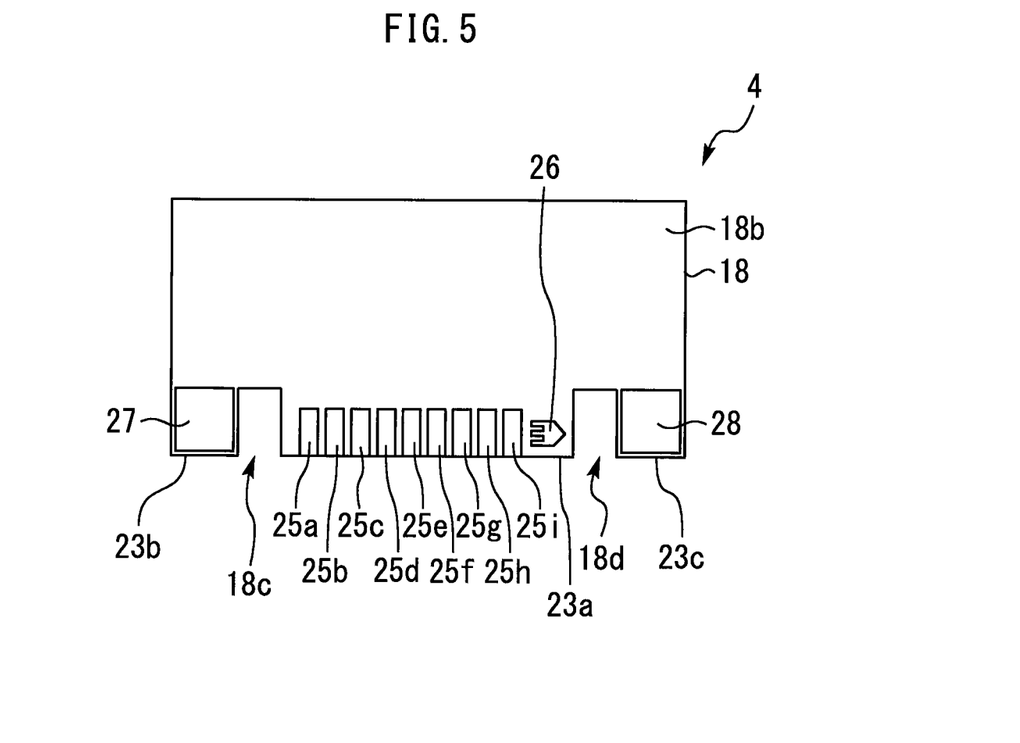
FIG. 5 is a back view of the printed wiring board included in the printed circuit board according to Embodiment 1 of the present invention.
Figure 6:
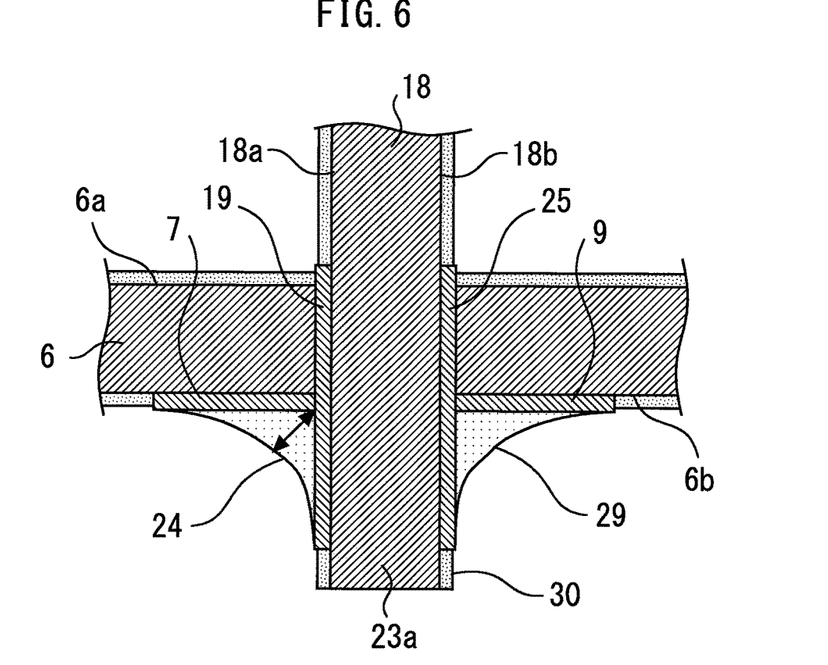
FIG. 6 is a diagram illustrating a cross-section taken along line A-A in FIG. 2 in a state where a coating film of the printed circuit board according to Embodiment 1 of the present invention is not provided.
Figure 7:
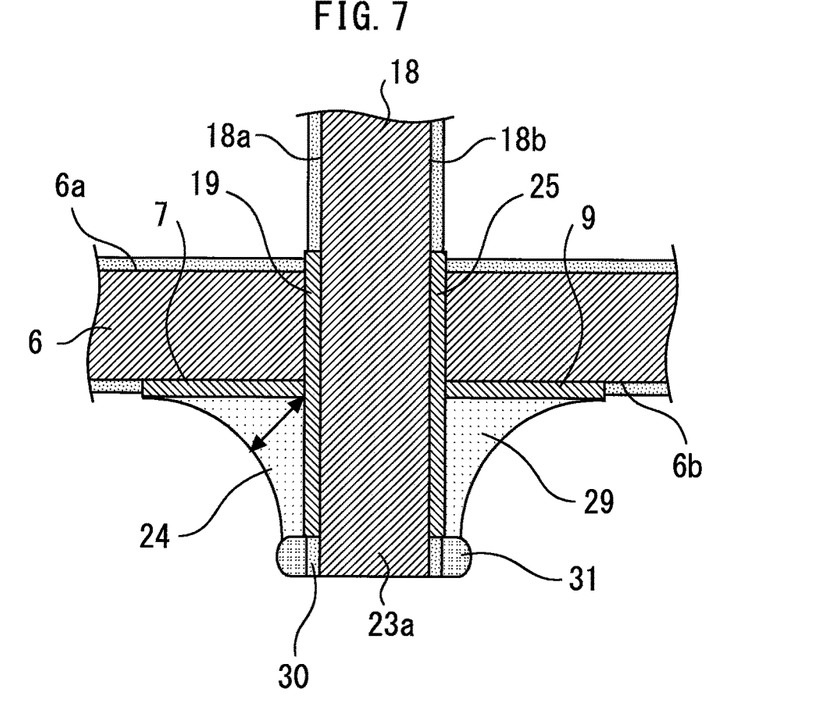
FIG. 7 is a diagram illustrating the cross-section taken along the line A-A in FIG. 2 in a state where the coating film of the printed circuit board according to Embodiment 1 of the present invention is provided.
Figure 12:
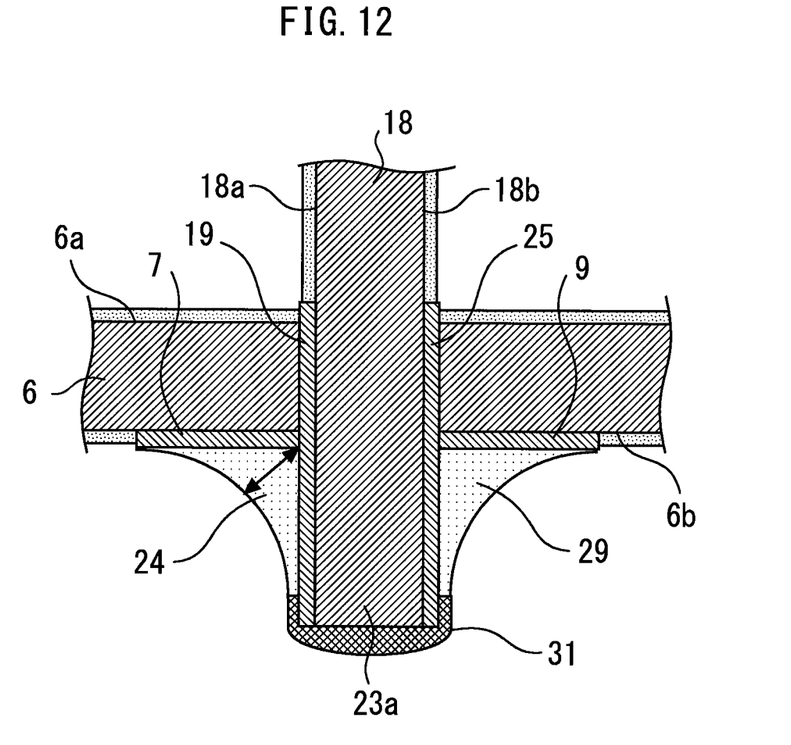
FIG. 12 is a diagram illustrating the cross-section taken along the line A-A in FIG. 2 in a state after a coating film of a printed circuit board (modification) according to Embodiment 1 of the present invention is formed.
Figure 13:
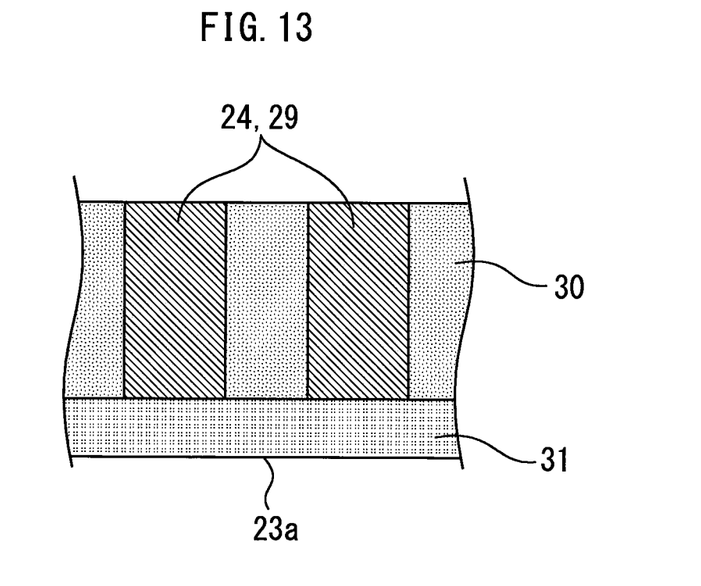
FIG. 13 is a main part enlarged view illustrating a modification of the printed circuit board according to Embodiment 1 of the present invention.
Figure 14:
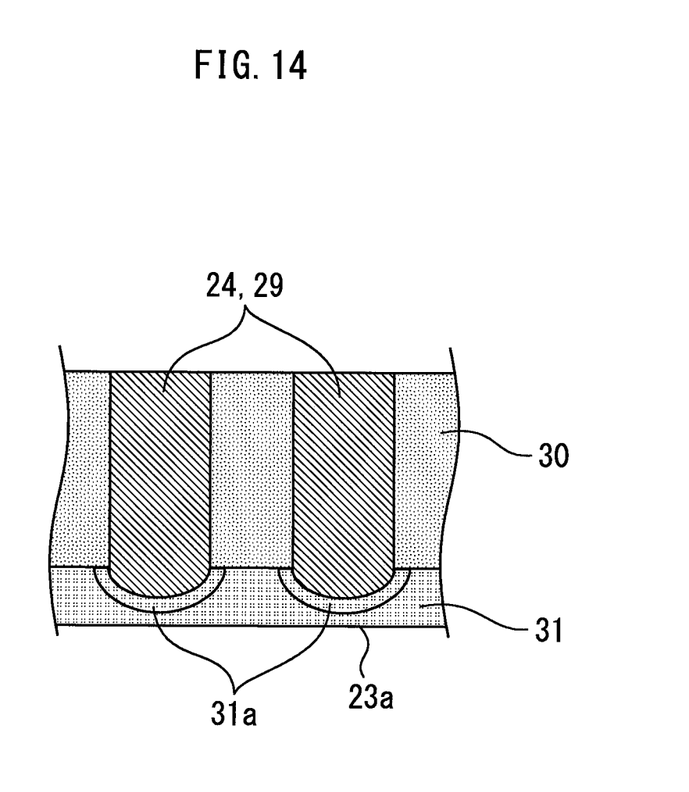
FIG. 14 is a main part enlarged view illustrating a modification of the printed circuit board according to Embodiment 1 of the present invention.

FIG. 1 to FIG. 14 relate to Embodiment 1 of the present invention. FIG. 1 and FIG. 2 are perspective views of a printed circuit board. FIG. 3 is a bottom view of a printed wiring board included in the printed circuit board. FIG. 4 is a front view of a printed wiring board included in the printed circuit board. FIG. 5 is a back view of the printed wiring board included in the printed circuit board. FIG. 6 is a diagram illustrating a cross-section taken along line A-A in FIG. 2 in a state where a coating film of the printed circuit board is not provided. FIG. 7 is a diagram illustrating the cross-section taken along the line A-A in FIG. 2 in a state where the coating film of the printed circuit board is provided. FIG. 8 to FIG. 11 are main part enlarged views each illustrating an example of the printed circuit board. FIG. 12 is a diagram illustrating the cross-section taken along the line A-A in FIG. 2 in a state after a coating film of a printed circuit board (modification) is formed. FIG. 13 and FIG. 14 are main part enlarged views each illustrating a modification of the printed circuit board.

To facilitate understanding, an x-axis, a y-axis, and a z-axis are set as illustrated in FIG. 1 and FIG. 2. The x-axis, the y-axis, and the z-axis are orthogonal to one another.

A printed circuit board 1 according to the present embodiment includes, for example, a printed wiring board 2, an electronic component 3, a printed wiring board 4, and an electronic component 5. The electronic component 3 is provided on the printed wiring board 2. The electronic component 5 is provided on the printed wiring board 4. For example, the printed wiring board 2 is larger than the printed wiring board 4. The printed wiring board 4 is provided to be orthogonal to the printed wiring board 2.

FIG. 3 is a diagram illustrating an example of the printed wiring board 2. The printed wiring board 2 includes, for example, an insulating substrate 6, a plurality of electrodes 7, a pad 8, a plurality of electrodes 9, a pad 10, and lands 11 to 14.

For example, the insulating substrate 6 has a plate shape with a constant thickness. The insulating substrate 6 includes a surface 6a and a surface 6b. The electronic component 3 is disposed on the surface 6a. The surface 6b is a surface directed to a direction opposite to a direction of the surface 6a. The x-axis is parallel to the surface 6a and the surface 6b. The y-axis is parallel to the surface 6a and the surface 6b. The z-axis is orthogonal to the surface 6a and the surface 6b.

A mounting hole 15, a mounting hole 16, and a mounting hole 17 are provided in the insulating substrate 6. The mounting hole 15, the mounting hole 16, and the mounting hole 17 are holes to mount the printed wiring board 4 on the printed wiring board 2. The mounting hole 15, the mounting hole 16, and the mounting hole 17 penetrate through the insulating substrate 6 from the surface 6a to the surface 6b. The mounting hole 15 is a long hole in which a width in the y-axis direction is larger than a width in the x-axis direction. Likewise, the mounting hole 16 is a long hole in which a width in the y-axis direction is larger than a width in the x-axis direction. The mounting hole 17 is a long hole in which a width in the y-axis direction is larger than a width in the x-axis direction. The mounting hole 15, the mounting hole 16, and the mounting hole 17 are arranged in a straight line in the y-axis direction. The mounting hole 15 is provided between the mounting hole 16 and the mounting hole 17.

In the present embodiment, an example in which the printed wiring board 2 includes nine electrodes 7 is described. The number of electrodes 7 included in the printed wiring board 2 is not limited to nine. In the following description, the electrodes 7 are denoted by reference numerals 7a to 7i to individually specify the electrodes 7. The electrodes 7a to 7i are provided on the surface 6b of the insulating substrate 6. The electrodes 7a to 7i configure a part of a printed circuit provided on the insulating substrate 6.

The electrodes 7a to 7i are arranged in a straight line in the y-axis direction. The electrodes 7a to 7i are arranged at an edge of the mounting hole 15. For example, the electrode 7a is disposed at an end among the electrodes 7a to 7i arranged in a line. The electrode 7b is adjacent to the electrode 7a. The electrode 7c is adjacent to the first electrode 7b. Likewise, the electrode 7h is adjacent to the electrode 7g. The electrode 7i is adjacent to the electrode 7h. The electrode 7i is disposed at an end among the electrodes 7a and 7i arranged in a line.

The pad 8 is provided on the surface 6b of the insulating substrate 6. The pad 8 may not configure a part of the printed circuit provided on the insulating substrate 6. For example, the pad 8 may not be electrically connected to the electrodes 7a to 7i. The electrodes 7a to 7i and the pad 8 are arranged in a line in the y-axis direction. The pad 8 is adjacent to the electrode 7i. The electrode 7i is disposed between the electrode 7h and the pad 8.

The pad 8 includes, for example, a solder pool portion, a plurality of adjacent portions, and a termination portion. The adjacent portions linearly extend from the solder pool portion toward the electrode 7i. The adjacent portions are disposed between the electrode 7i and the solder pool portion. The termination portion extends from the solder pool portion in a direction opposite to the extending direction of the adjacent portions. For example, a width of the termination portion in the x-axis direction is gradually reduced as it goes away from the electrode 7i.

In the present embodiment, an example in which the printed wiring board 2 includes nine electrodes 9 is described. The number of electrodes 9 included in the printed wiring board 2 is not limited to nine. In the following description, the electrodes 9 are denoted by reference numerals 9a to 9i to individually specify the electrodes 9. The electrodes 9a to 9i are provided on the surface 6b of the insulating substrate 6. The electrodes 9a to 9i configure a part of the printed circuit provided on the insulating substrate 6.

The electrodes 9a to 9i are arranged in a straight line in the y-axis direction. The electrodes 9a to 9i are arranged at an edge of the mounting hole 15. The electrodes 9a to 9i are arranged to respectively face the electrodes 7a to 7i with the mounting hole 15 in between. For example, the electrode 9a is disposed at an end among the electrodes 9a to 9i arranged in a line. The electrode 9a is disposed to face the electrode 7a with the mounting hole 15 in between. The electrode 9b is adjacent to the electrode 9a. The electrode 9b is disposed to face the electrode 7b with the mounting hole 15 in between. Likewise, the electrode 9h is adjacent to the electrode 9g. The electrode 9h is disposed to face the electrode 7h with the mounting hole 15 in between. The electrode 9i is adjacent to the electrode 9h. The electrode 9i is disposed to face the electrode 7i with the mounting hole 15 in between. The electrode 9i is disposed at an end among the electrodes 9a to 9i arranged in a line.

The pad 10 is provided on the surface 6b of the insulating substrate 6. The pad 10 may not configure a part of the printed circuit provided on the insulating substrate 6. For example, the pad 10 may not be electrically connected to the electrodes 9a to 9i. The electrodes 9a to 9i and the pad 10 are arranged in a line in the y-axis direction. The pad 10 is adjacent to the electrode 9i. The electrode 9i is disposed between the electrode 9h and the pad 10.

The electrodes 9 and the pad 10 are arranged in a manner similar to the arrangement of the electrodes 7 and the pad 8. The pad 10 has a shape similar to the shape of the pad 8. The pad 10 includes, for example, a solder pool portion, a plurality of adjacent portions, and a termination portion. The adjacent portions linearly extend from the solder pool portion toward the electrode 9i. The adjacent portions are disposed between the electrode 9i and the solder pool portion. The termination portion extends from the solder pool portion in a direction opposite to the extending direction of the adjacent portions. For example, a width of the termination portion in the x-axis direction is gradually reduced as it goes away from the electrode 9i.

The lands 11 to 14 are provided on the surface 6b of the insulating substrate 6. The lands 11 to 14 may not configure a part of the printed circuit provided on the insulating substrate 6. The land 11 and the land 12 are disposed at an edge of the mounting hole 16. The land 12 is disposed to sandwich the mounting hole 16 together with the land 11. The land 13 and the land 14 are disposed at an edge of the mounting hole 17. The land 14 is disposed to sandwich the mounting hole 17 together with the land 13. The land 11 and the land 13 are disposed so as to be partially aligned with the electrodes 7a to 7i and the pad 8 in a straight line. The land 12 and the land 14 are disposed so as to be partially aligned with the electrodes 9a to 9i and the pad 10 in a straight line.

FIG. 4 and FIG. 5 are diagrams illustrating an example of the printed wiring board 4. As illustrated in FIG. 4, the printed wiring board 4 includes, for example, an insulating substrate 18, a plurality of electrodes 19, a pad 20, a land 21, and a land 22.

For example, the insulating substrate 18 has a plate shape with a constant thickness. The insulating substrate 18 includes a surface 18a and a surface 18b. FIG. 4 is a diagram illustrating the printed wiring board 4 as viewed from the surface 18a side of the insulating substrate 18. The electronic component 5 is disposed on, for example, the front surface 18a. The surface 18b is a surface directed to a direction opposite to a direction of the surface 18a. The y-axis is parallel to the surface 18a and the surface 18b. The z-axis is parallel to the surface 18a and the surface 18b. The x-axis is orthogonal to the surface 18a and the surface 18b.

The insulating substrate 18 includes, for example, a connection portion 23a, a connection portion 23b, and a connection portion 23c. The connection portion 23a, the connection portion 23b, and the connection portion 23c are provided on the insulating substrate 18 by, for example, forming a notch 18c and a notch 18d.

The connection portion 23a penetrates through the mounting hole 15 from the surface 6a side, and protrudes from the surface 6b of the insulating substrate 6. The connection portion 23b penetrates through the mounting hole 16 from the surface 6a side, and protrudes from the surface 6b of the insulating substrate 6. Further, the connection portion 23c penetrates through the mounting hole 17 from the surface 6a side, and protrudes from the surface 6b of the insulating substrate 6.

In the present embodiment, an example in which the printed wiring board 4 includes nine electrodes 19 is described. The number of electrodes 19 included in the printed wiring board 4 is not limited to nine. In the following description, the electrodes 19 are denoted by reference numerals 19a to 19i to individually specify the electrodes 19. The electrodes 19a to 19i are provided on the surface 18a of the insulating substrate 18. More specifically, the electrodes 19a to 19i are provided on the surface 18a of the connection portion 23a. The electrodes 19a to 19i configure a part of a printed circuit provided on the insulating substrate 18.

The electrodes 19a to 19i are arranged in a straight line in the y-axis direction. The electrodes 19a to 19i are arranged at an edge of the insulating substrate 18. More specifically, the electrodes 19a to 19i are arranged in the connection portion 23a. For example, the electrode 19a is disposed at an end among the electrodes 19a to 19i arranged in a line. The electrode 19b is adjacent to the electrode 19a. The electrode 19c is adjacent to the electrode 19b. The electrode 19h is adjacent to the electrode 19g. The electrode 19i is adjacent to the electrode 19h. The electrode 19i is disposed at an end among the electrodes 19a to 19i arranged in a line.

The pad 20 is provided on the surface 18a of the insulating substrate 18. More specifically, the pad 20 is provided on the surface 18a of the connection portion 23a. The pad 20 may not configure a part of the printed circuit provided on the insulating substrate 18. For example, the pad 20 may not be electrically connected to the electrodes 19a to 19i. The electrodes 19a to 19i and the pad 20 are arranged in a line in the y-axis direction. The pad 20 is adjacent to the electrode 19i. The electrode 19i is disposed between the electrode 19h and the pad 20.

The electrodes 19 and the pad 20 are arranged in a manner similar to the arrangement of the electrodes 7 and the pad 8. The pad 20 has a shape similar to the shape of the pad 8. The pad 20 includes, for example, a solder pool portion, a plurality of adjacent portions, and a termination portion. The adjacent portions each include a portion adjacent to the electrode 19i. The adjacent portions linearly extend from the solder pool portion toward the electrode 19i. The adjacent portions are disposed between the electrode 19i and the solder pool portion. For example, three adjacent portions extend from the solder pool portion toward the electrode 19i.

The termination portion extends from the solder pool portion in a direction opposite to the extending direction of the adjacent portions. The solder pool portion is disposed between the adjacent portions and the termination portion. For example, the termination portion has a triangular shape. A width of the termination portion in the z-axis direction is gradually reduced as it goes away from the electrode 19i.

The land 21 and the land 22 are provided on the surface 18a of the insulating substrate 18. More specifically, the land 21 is provided on the surface 18a of the connection portion 23b. The land 22 is provided on the surface 18a of the connection portion 23c. The land 21 and the land 22 may not configure a part of the printed circuit provided on the insulating substrate 18.

The land 21 is disposed to sandwich the notch 18c together with the electrode 19a. The land 21 is disposed so as to be partially aligned with the electrodes 19a to 19i and the pad 20 in a straight line. The land 22 is disposed to sandwich the notch 18d together with the pad 20. The land 22 is disposed so as to be partially aligned with the electrodes 19a to 19i and the pad 20 in a straight line.

FIG. 5 is a diagram illustrating the printed wiring board 4 as viewed from the surface 18b side as a rear surface of the surface 18a. In the printed wiring board 4, a configuration on the surface 18b side is similar to the configuration on the surface 18a side. The printed wiring board 4 includes, for example, a plurality of electrodes 25, a pad 26, a land 27, and a land 28.

In the present embodiment, an example in which the printed wiring board 4 includes nine electrodes 25 is described. The number of electrodes 25 included in the printed wiring board 4 is not limited to nine. In the following description, the electrodes 25 are denoted by reference numerals 25a to 25i to individually specify the electrodes 25. The electrodes 25a to 25i are provided on the surface 18b of the insulating substrate 18. More specifically, the electrodes 25a to 25i are provided on the surface 18b of the connection portion 23a. The electrodes 25a to 25i configure a part of the printed circuit provided on the insulating substrate 18.

The electrodes 25a to 25i are arranged in a straight line in the y-axis direction. The electrodes 25a to 25i are arranged at an edge of the insulating substrate 18. More specifically, the electrodes 25a to 25i are arranged in the connection portion 23a. For example, the electrode 25a is disposed at an end among the electrodes 25a to 25i arranged in a line. The electrode 25b is adjacent to the electrode 25a. The electrode 25h is adjacent to the electrode 25g. The electrode 25i is adjacent to the electrode 25h. The electrode 25i is disposed at an end among the electrodes 25a to 25i arranged in a line.

The pad 26 is provided on the surface 18b of the insulating substrate 18. More specifically, the pad 26 is provided on the surface 18b of the connection portion 23a. The pad 26 may not configure a part of the printed circuit provided on the insulating substrate 18. For example, the pad 26 may not be electrically connected to the electrodes 25a to 25i. The electrodes 25a to 25i and the pad 26 are arranged in a line in the y-axis direction. The pad 26 is adjacent to the electrode 25i. The electrode 25i is disposed between the electrode 25h of the pad 26.

The electrodes 25 and the pad 26 are arranged in a manner similar to the arrangement of the electrodes 7 and the pad 8. The pad 26 has a shape similar to the shape of the pad 8. The pad 26 includes, for example, a solder pool portion, a plurality of adjacent portions, and a termination portion. The adjacent portions each include a portion adjacent to the electrode 25i. The adjacent portions linearly extend from the solder pool portion toward the electrode 25i. The adjacent portions are disposed between the electrode 25i and the solder pool portion. For example, three adjacent portions extend from the solder pool portion toward the electrode 25i.

The termination portion extends from the solder pool portion in a direction opposite to the extending direction of the adjacent portions. The solder pool portion is disposed between the adjacent portions and the termination portion. For example, the termination portion has a triangular shape. A width of the termination portion in the z-axis direction is gradually reduced as it goes away from the electrode 25i.

The land 27 and the land 28 are provided on the surface 18b of the insulating substrate 18. More specifically, the land 27 is provided on the surface 18b of the connection portion 23b. The land 28 is provided on the surface 18b of the connection portion 23c. The land 27 and the land 28 may not configure a part of the printed circuit provided on the insulating substrate 18.

The land 27 is disposed to sandwich the notch 18c together with the electrode 25a. The land 27 is disposed so as to be partially aligned with the electrodes 25a to 25i and the pad 26 in a straight line. The land 28 is disposed to sandwich the notch 18d together with the pad 26. The land 28 is disposed so as to be partially aligned with the electrodes 25a to 25i and the pad 26 in a straight line.

The printed circuit board 1 is configured in the following manner by the printed wiring board 2 and the printed wiring board 4 having the above-described configurations. First, the printed wiring board 4 is disposed to be orthogonal to the printed wiring board 2. At this time, the connection portion 23a is inserted into the mounting hole 15 from the surface 6a side, and is protruded from the surface 6b of the insulating substrate 6. The connection portion 23b is inserted into the mounting hole 16, and is protruded from the surface 6b of the insulating substrate 6. The connection portion 23c is inserted into the mounting hole 17, and is protruded from the surface 6b of the insulating substrate 6.

In this state, as illustrated in FIG. 2, the electrodes 19a to 19i of the insulating substrate 18 are disposed to be respectively adjacent to the electrodes 7a to 7i provided on the insulating substrate 6. FIG. 6 is a diagram illustrating a cross-section taken along line A-A in FIG. 2. As illustrated in FIG. 6, the electrode 7a is provided on the surface 6b of the insulating substrate 6. The electrode 19a is disposed to be adjacent to the electrode 7a provided on the insulating substrate 6. Further, solder 24 is provided between the electrode 19a and the electrode 7a. The electrode 19a is joined to the electrode 7a by the solder 24.

In addition, the electrode 19b is disposed to be adjacent to the electrode 7b. A cross-section including the electrode 19b and the electrode 7b is similar to the cross-section illustrated in FIG. 6. The solder 24 is provided between the electrode 19b and the electrode 7b. The electrode 19b is joined to the electrode 7b by the solder 24. Note that the electrode 19b and the electrode 19a are not connected by the solder 24. Further, the electrode 7b and the electrode 7a are not connected by the solder 24.

The other electrodes 19c to 19i are respectively joined to the electrodes 7c to 7i by the solder in a similar manner.

The land 21 of the insulating substrate 18 is disposed to be adjacent to the land 11 of the insulating substrate 6. A cross-section including the land 21 and the land 11 is similar to the cross-section illustrated in FIG. 6. The solder 24 is provided between the land 21 and the land 11. The land 21 is fixed to the land 11 by the solder 24. In addition, the land 22 of the insulating substrate 18 is disposed to be adjacent to the land 13 of the insulating substrate 6. A cross-section including the land 22 and the land 13 is similar to the cross-section illustrated in FIG. 6. The solder 24 is provided between the land 22 and the land 13. The land 22 is fixed to the land 13 by the solder 24.

Further, in this state, the electrodes 25a to 25i of the insulating substrate 18 are disposed to be respectively adjacent to the electrodes 9a to 9i provided on the insulating substrate 6. More specifically, for example, the electrode 25a is disposed to be adjacent to the electrode 9a provided on the insulating substrate 6. As illustrated in FIG. 6, solder 29 is provided between the electrode 25a and the electrode 9a. The electrode 25a is joined to the electrode 9a by the solder 29. As illustrated in FIG. 6, the electrode 9a is provided on the surface 6b of the insulating substrate 6.

Further, the electrode 25b is disposed to be adjacent to the electrode 9b. A cross-section including the electrode 25b and the electrode 9b is similar to the cross-section illustrated in FIG. 6. The solder 29 is provided between the electrode 25b and the electrode 9b. The electrode 25b is joined to the electrode 9b by the solder 29. Note that the electrode 25b and the electrode 25a are not connected by the solder 29. The electrode 9b and the electrode 9a are not connected by the solder 29.

The other electrodes 25c to 25i are respectively joined to the electrodes 9c to 9i by the solder in a similar manner.

The land 27 of the insulating substrate 18 is disposed to be adjacent to the land 12 of the insulating substrate 6. A cross-section including the land 27 and the land 12 is similar to the cross-section illustrated in FIG. 6. The solder 29 is provided between the land 27 and the land 12. The land 27 is fixed to the land 12 by the solder 29. In addition, the land 28 of the insulating substrate 18 is disposed to be adjacent to the land 14 of the insulating substrate 6. A cross-section including the land 28 and the land 14 is similar to the cross-section illustrated in FIG. 6. The solder 29 is provided between the land 28 and the land 14. The land 28 is fixed to the land 14 by the solder 29.

In the printed circuit board 1 having the above-described configuration according to Embodiment 1, the insulating substrate 6 is an example of a first insulating substrate. The insulating substrate 6 as the first insulating substrate includes the mounting hole 15. When the y-axis direction is defined as a first direction and the x-axis direction is defined as a second direction, the second direction is orthogonal to the first direction. The mounting hole 15 is a long hole in which a width in the second direction is larger than a width in the first direction. In addition, the surface 6a of the insulating substrate 6 is a first surface of the first insulating substrate. The surface 6b of the insulating substrate 6 is a second surface of the first insulating substrate.

In the printed circuit board 1 according to Embodiment 1, the insulating substrate 18 is an example of a second insulating substrate. The insulating substrate 18 as the second insulating substrate includes the connection portion 23a that penetrates through the mounting hole 15 from the surface 6a as the first surface and protrudes from the surface 6b as the second surface. The electrodes 7 and the electrodes 9 of the insulating substrate 6 are examples of a first electrode provided on the surface 6b as the second surface described above. Further, the electrodes 7 and the electrodes 9 as the first electrodes are arranged at the edge of the mounting hole 15 along the x-axis direction, namely, along the second direction.

The electrodes 19 and the electrodes 25 of the insulating substrate 18 are examples of a second, electrode provided in the connection portion 23a. The electrodes 19 and the electrodes 25 as the second electrodes are respectively joined to the first electrodes, namely, the electrodes 7 and the electrodes 9 by the solder 29.

The surface 6a and the surface 6b of the insulating substrate 6 are covered with a resist 30. However, a portion of each of the electrodes including the electrodes 7 and the electrodes 9 is not covered with the resist 30. Likewise, the surface 18a and the surface 18b of the insulating substrate 18 are covered with the resist 30 except for a portion of each of the electrodes including the electrodes 19 and the electrodes 25. Accordingly, as illustrated in FIG. 6, the resist 30 is present on a front end side of each of the electrodes 19 and the electrodes 25 in the connection portion 23a.

Further, as illustrated in FIG. 7, a coating film 31 is provided in the connection portion 23a. The coating film 31 is provided by, for example, silk printing. The coating film 31 is applied and provided on a surface of one or both of the second electrodes (electrodes 19 and electrodes 25) and the resist 30 in the connection portion 23a. The coating film 31 is provided at least on the front end side of the connection portion 23a relative to the portions where the second electrodes (electrodes and electrodes 25) are joined to the first electrodes (electrodes 7 and electrodes 9) by the solder.

Next, a method of joining the printed wiring board 2 illustrated in FIG. 3 having the above-described configuration and the printed wiring board 4 illustrated in FIG. 4 and FIG. 5 having the above-described configuration, by the solder is described.

First, the printed wiring board 4 is disposed to be orthogonal to the printed wiring board 2. At this time, the connection portion 23a is inserted into the mounting hole 15 from the surface 6a side, and is protruded from the surface 6b of the insulating substrate 6. Further, the connection portion 23b is inserted into the mounting hole 16 from the surface 6a side, and is protruded from the surface 6b of the insulating substrate 6. The connection portion 23c is inserted into the mounting hole 17 from the surface 6a side, and is protruded from the surface 6b of the insulating substrate 6.

Next, the surface 6b is directed downward, and the printed wiring board 2 is fixed to a conveyance device of a flow soldering apparatus. The printed wiring board 4 is disposed in a state standing on the printed wiring board 2 such that the connection portions 23a to 23c protrude downward from the printed wiring board 2. In the flow soldering apparatus, molten solder is jetted upward from a nozzle. The printed wiring board 2 and the printed wiring board 4 supported by the printed wiring board 2 are conveyed by the conveyance device, and pass across above the nozzle. When the printed wiring board 2 passes above the nozzle, a bottom surface of the printed wiring board 2 is immersed in the molten solder jetted from the nozzle. In addition, a portion of the printed wiring board 4 protruding from the bottom surface of the printed wiring board 2 is immersed in the molten solder jetted from the nozzle.

The printed wiring board 2 is disposed such that the electrode 7a is immersed in the molten solder from the nozzle before the electrode 7i. In the case of the configuration example illustrated in FIG. 1 and FIG. 2, the printed wiring board 2 is conveyed by the conveyance device in a −y-direction. Therefore, the electrode 7i is immersed in the molten solder next to the electrode 7h, and the pad 8 is immersed in the molten solder after the electrode 7i. Further, the printed wiring board 4 is disposed such that the electrode 19a is immersed in the molten solder from the nozzle before the electrode 19i. Therefore, the electrode 19i is immersed in the molten solder next to the electrode 19h, and the pad 20 is immersed in the molten solder next to the electrode 19i.

For example, when the electrode 7a and the electrode 19a are immersed in the molten solder from the nozzle, the solder 24 is provided between the electrode 7a and the electrode 19a. Likewise, when the electrode 7h and the electrode 19h are immersed in the molten solder from the nozzle, the solder 24 is provided between the electrode 7h and the electrode 19h. When the electrode 7i and the electrode 19i are immersed in the molten solder from the nozzle, the solder 24 is provided between the electrode 7i and the electrode 19i.

In the configuration example illustrated in the present embodiment, the electrodes 7a to 7i are arranged in a line in the conveyance direction by the conveyance device. Therefore, the electrodes 7a to 7i are immersed in the molten solder from the nozzle in order from the electrode 7a. The pad 8 is immersed in the molten solder from the nozzle next to the electrode 7i. The electrodes 7a to 7i are separated from the molten solder from the nozzle in a similar order. In other words, the electrodes 7a to 7i are separated from the molten solder from the nozzle in order from the electrode 7a. The pad 8 is separated from the molten solder from the nozzle next to the electrode 7i.

If the pad 8 is not provided next to the electrode 7*i*, the solder more than necessary remains in the electrode 7*i* when the molten solder is separated from the electrode 7*i*. As a result, what is called a bridge occurs between the electrode 7*h* and the electrode 7*i*. In other words, the electrode 7*h* and the electrode 7*i* are connected by the solder. When the pad 8 is provided next to the electrode 7*i*, it is possible to suppress the solder remaining on the electrode 7*i* to a necessary amount and to guide the excess solder to the pad 8. This makes it possible to prevent occurrence of the bridge between the electrode 7*h* and the electrode 7*i*.

Further, the molten solder is jetted upward to the electrodes 19 and the electrodes 25 that are the second electrodes of the connection portion 23*a* protruding downward from the printed wiring board 2. Therefore, when the printed circuit board 1 is separated from the solder jet, the solder for the second electrodes is easily taken by a solder bath side due to influence of gravity and surface tension of the solder.

In this regard, in the printed circuit board 1 according to the present embodiment, the coating film 31 is provided on the front end side of the connection portion 23*a* relative to the portions where the second electrodes (electrodes 19 and electrodes 25) are joined to the first electrodes (electrodes 7 and electrodes 9) by the solder. Further, the part on the front end side of the connection portion 23*a* relative to the soldered portions of the second electrodes (electrodes 19 and electrodes 25) is made thick by the coating film 31. Accordingly, a larger amount of solder can be retained on the second electrodes (electrode 19 and electrodes 25) on an upper side of the coating film 31, and it is possible to prevent the solder for the second electrodes (electrodes 19 and electrodes 25) from being taken by the solder bath from the front end side of the connection portion 23*a*. This makes it possible to increase the amount of molten solder adhering over the first electrodes (electrodes 7 and electrodes 9) and the second electrodes (electrodes 19 and electrodes 25). In other words, a solder thickness (for example, a portion illustrated by arrow in FIG. 7) by flow soldering can be stably made thick, and shortening of a lifetime due to thermal fatigue at the soldered portions can be suppressed.

Figure 8:
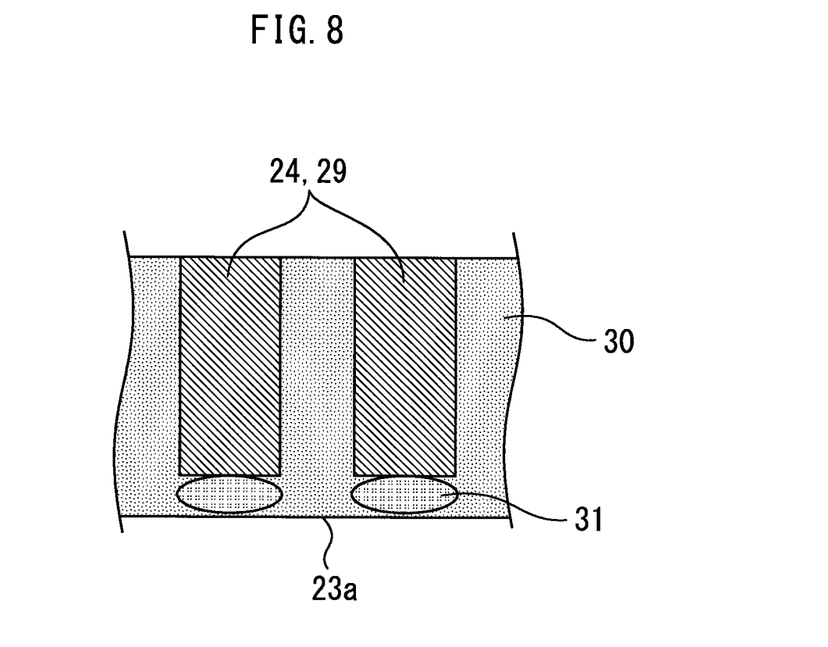
FIG. 8 is a main part enlarged view illustrating an example of the printed circuit board according to Embodiment 1 of the present invention.
Figure 9:
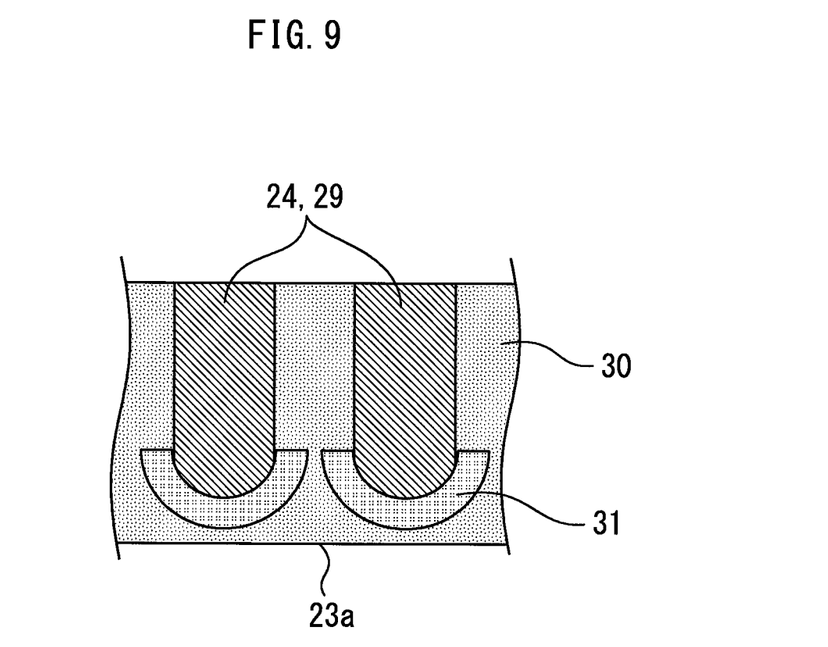
FIG. 9 is a main part enlarged view illustrating an example of the printed circuit board according to Embodiment 1 of the present invention.

Next, specific examples of a print pattern of the coating film 31 in the printed circuit board 1 according to the present embodiment are described with reference to FIG. 8 to FIG. 11. As described above, in the configuration example of the present embodiment, the plurality of second electrodes (electrodes 19 and electrodes 25) are arranged in a line in the y-axis direction. FIG. 8 and FIG. 9 each illustrate a print pattern example in a case where the coating film 31 is provided for each of the second electrodes.

First, in the example illustrated in FIG. 8, the coating film 31 is provided between each of the second electrodes (electrodes 19 and electrodes 25) and the front end of the connection portion 23*a*. In this configuration example, the coating films 31 are provided on the surface of the resist 30 of the connection portion 23*a*. According to such a configuration example, in the flow soldering, it is possible to reduce the amount of solder taken by the solder bath from each of the second electrodes (electrodes 19 and electrodes 25) by the corresponding coating film 31.

Next, in the example illustrated in FIG. 9, the coating film 31 is disposed in an arc shape at a front end part of each of the second electrodes (electrodes 19 and electrodes 25). Each of the coating films 31 is projected toward the front end of the connection portion 23*a*, and is recessed toward the corresponding second electrode. In this configuration example, the coating films 31 are provided on the surfaces of both of the second electrodes (electrodes 19 and electrodes 25) and the resist 30 in the connection portion 23*a*. According to such a configuration example, in the flow soldering, a larger amount of solder can be retained in the inside of the recessed part of each of the arc-shaped coating films 31. This makes it possible to further increase the amount of molten solder adhering to the first electrodes and the second electrodes.

Figure 10:
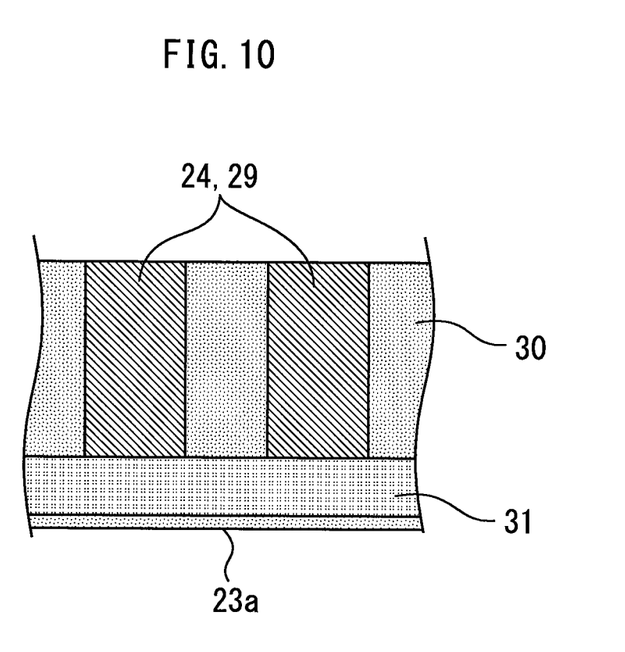
FIG. 10 is a main part enlarged view illustrating an example of the printed circuit board according to Embodiment 1 of the present invention.
Figure 11:
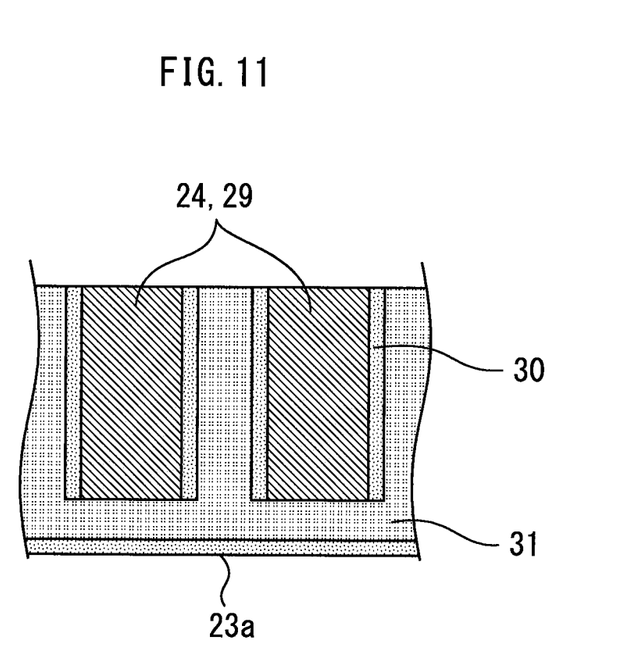
FIG. 11 is a main part enlarged view illustrating an example of the printed circuit board according to Embodiment 1 of the present invention.

In contrast, FIG. 10 and FIG. 11 each illustrate a print pattern example in a case where at least a part of the coating film 31 is linearly provided along the arrangement direction of the second electrodes, namely, along the y-axis direction. More specifically, as illustrated in FIG. 10, the coating film 31 is linearly provided between the second electrodes (electrodes 19 and electrodes 25) and the front end of the connection portion 23*a*. Such a configuration also makes it possible to reduce the amount of solder taken by the solder bath from the second electrodes (electrodes 19 and electrodes 25) in the flow soldering, by the linear coating film 31.

Alternatively, as illustrated in FIG. 11, the coating film 31 may be extended from the linear portion to a portion between the second electrodes (electrodes 19 and electrode 25). This makes it possible to prevent occurrence of a bridge between the second electrodes (electrodes 19 and electrodes 25).

Next, a modification of the printed circuit board 1 according to the present embodiment is described with reference to FIG. 12 to FIG. 14. In the configuration examples described above, for example, as illustrated in FIG. 6, the resist 30 is provided on the front end side of each of the electrodes 19 and the electrodes 25 in the connection portion 23*a*. In contrast, in the modification described below, the electrodes 19 and the electrodes 25 each reach the front end of the connection portion 23*a* as illustrated in FIG. 12. Therefore, the coating film 31 is basically applied and provided on the surfaces of the respective second electrodes (electrodes 19 and electrodes 25) of the connection portion 23*a*.

In particular, in the configuration example illustrated in FIG. 12, an end surface at the front end of the connection portion 23*a* is coated with the coating film 31. As a result, in manufacturing the printed circuit board 1, the coating film 31 can be formed over both of the surface 18*a* and the surface 18*b* of the insulating substrate 18 at a time by, for example, immersing the front end of the connection portion 23*a* in a paint bath before the process of the flow soldering.

Next, a specific example of the print pattern of the coating film 31 in the modification of the printed circuit board 1 according to the present embodiment is described. FIG. 13 illustrates a configuration example in which the coating film 31 is linearly provided along the arrangement direction of the second electrodes, namely, along the y-axis direction over the plurality of second electrodes (electrodes 19 and electrodes 25). Such a configuration makes it possible to reduce the amount of solder taken by the solder bath from the second electrodes (electrodes 19 and electrodes 25) in the flow soldering, by the linear coating film 31.

FIG. 14 illustrates a case where arc-shaped portions 31*a* are provided in the linear coating film 31 in the configuration example of FIG. 13. The arc-shaped portions 31*a* are provided to correspond to the respective second electrodes (electrodes 19 and electrodes 25). Each of the arc-shaped portions 31*a* is projected toward the front end of the connection portion 23*a*, and is recessed toward the corresponding second electrode. According to such a configuration example, in the flow soldering, a larger amount of solder can be retained in the inside of the recessed part of each of the arc-shaped portions 31*a* of the coating film 31. This makes it possible to further increase the amount of molten solder adhering to the first electrodes and the second electrodes.

INDUSTRIAL APPLICABILITY

The present invention is usable in the printed circuit board including the plurality of insulating substrates, in particular, the printed circuit board that includes the first insulating substrate provided with the mounting holes, and the second insulating substrate penetrating through the mounting holes of the first insulating substrate and in which the electrodes of the first insulating substrate and the electrodes of the second insulating substrate are joined by the flow soldering.

REFERENCE SIGNS LIST

1 Printed circuit board
2 Printed wiring board
3 Electronic component
4 Printed wiring board
5 Electronic component
6 Insulating substrate (First insulating substrate)
6a Surface (First surface)
6b Surface (Second surface)
7 Electrode (First electrode)
8 Pad
9 Electrode (First electrode)
10 Pad
11-14 Lands
15-17 Mounting holes
18 Insulating substrate (Second insulating substrate)
18a-b Surfaces
18c-d Notches
19 Electrode (Second electrode)
20 Pad
21-22 Lands
23a-23c Connection portions
24 Solder
25 Electrode (Second electrode)
26 Pad
27-28 Lands
29 Solder
30 Resist
31 Coating film
31a Arc-shaped portion

The invention claimed is:

1. A printed circuit board, comprising:
a first insulating substrate having a mounting hole therein, the mounting hole penetrating through the first insulating substrate from a first surface to a second surface;
a second insulating substrate including a connection portion, the connection portion penetrating through the mounting hole from the first surface side and protrudes from the second surface;
a first electrode provided on the second surface and disposed at an edge of the mounting hole; and
a second electrode provided on the connection portion,
the first electrode and the second electrode being joined by solder, and
the printed circuit board further including a coating film that is disposed at least on a front end side of the connection portion than a portion where the second electrode is joined to the first electrode by the solder, wherein
the coating film coats an end surface of the front end of the connection portion.

2. The printed circuit board according to claim 1, further comprising a resist provided on a portion not provided with the second electrode in the connection portion, wherein
the coating film is applied and provided on a surface of one or both of the second electrode and the resist in the connection portion.

3. A printed circuit board, comprising:
a first insulating substrate having a mounting hole therein, the mounting hole penetrating through the first insulating substrate from a first surface to a second surface;
a second insulating substrate including a connection portion, the connection portion penetrating through the mounting hole from the first surface side and protrudes from the second surface;
a first electrode provided on the second surface and disposed at an edge of the mounting hole; and
a second electrode provided on the connection portion,
the first electrode and the second electrode being joined by solder, and
the printed circuit board further including a coating film that is disposed at least on a front end side of the connection portion than a portion where the second electrode is joined to the first electrode by the solder, wherein
a plurality of the second electrodes are provided, and
the coating film is provided for each of the second electrodes.

4. The printed circuit board according to claim 3, further comprising a resist provided on a portion not provided with the second electrode in the connection portion, wherein
the coating film is applied and provided on a surface of one or both of the second electrode and the resist in the connection portion.

5. A printed circuit board, comprising:
a first insulating substrate having a mounting hole therein, the mounting hole penetrating through the first insulating substrate from a first surface to a second surface;
a second insulating substrate including a connection portion, the connection portion penetrating through the mounting hole from the first surface side and protrudes from the second surface;
a first electrode provided on the second surface and disposed at an edge of the mounting hole; and
a second electrode provided on the connection portion,
the first electrode and the second electrode being joined by solder, and
the printed circuit board further including a coating film that is disposed at least on a front end side of the connection portion than a portion where the second electrode is joined to the first electrode by the solder, wherein
a plurality of the second electrodes are provided, and
the coating film is linearly provided along a direction in which the second electrodes are arranged.

6. The printed circuit board according to claim 5, further comprising a resist provided on a portion not provided with the second electrode in the connection portion, wherein
the coating film is applied and provided on a surface of one or both of the second electrode and the resist in the connection portion.

* * * * *